US011728619B2

United States Patent
He et al.

(10) Patent No.: US 11,728,619 B2
(45) Date of Patent: Aug. 15, 2023

(54) SIDE MODE SUPPRESSION FOR EXTENDED C-BAND TUNABLE LASER (71) Applicant: INPHI CORPORATION, Santa Clara, CA (US)

(72) Inventors: Xiaoguang He, Diamond Bar, CA (US); Radhakrishnan L. Nagarajan, Santa Clara, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 230 days.

(21) Appl. No.: 16/922,622

(22) Filed: Jul. 7, 2020

(65) Prior Publication Data
US 2022/0013978 A1 Jan. 13, 2022

(51) Int. Cl.
*H01S 5/028* (2006.01)
*H01S 5/02* (2006.01)
(Continued)

(52) U.S. Cl.
CPC ............ *H01S 5/0287* (2013.01); *H01S 5/021* (2013.01); *H01S 5/026* (2013.01); *H01S 5/142* (2013.01);
(Continued)

(58) Field of Classification Search
CPC ........... H01S 5/2022; H01S 5/141–142; H01S 5/0287–0288
See application file for complete search history.

(56) References Cited

U.S. PATENT DOCUMENTS 7,962,045 B2 * 6/2011 McCallion .......... H01S 5/06256
398/201
10,162,199 B2 * 12/2018 Zheng ...................... H01S 5/50
(Continued)

FOREIGN PATENT DOCUMENTS

CN 102315590 A * 1/2012 ........... H01S 5/1064
CN 106785882 A * 5/2017
(Continued)

OTHER PUBLICATIONS

European Search Report for European Application No. 21214401.8 dated May 12, 2022.
(Continued)

*Primary Examiner* — Joshua King (57) ABSTRACT

A method for improving wide-band wavelength-tunable laser. The method includes configuring a gain region between a first facet and a second facet and crosswise a PN-junction with an active layer between P-type cladding layer and N-type cladding layer. The method further includes coupling a light excited in the active layer and partially reflected from the second facet to pass through the first facet to a wavelength tuner configured to generate a joint interference spectrum with multiple modes separated by a joint-free-spectral-range (JFSR). Additionally, the method includes configuring the second facet to have reduced reflectivity for increasing wavelengths. Furthermore, the method includes reconfiguring the gain chip with an absorption layer near the active layer to induce a gain loss for wavelengths shorter than a longest wavelength associated with a short-wavelength side mode. Moreover, the method includes outputting amplified light at a basic mode via the second facet.

12 Claims, 8 Drawing Sheets

(51) Int. Cl.
*H01S 5/026* (2006.01)
*H01S 5/14* (2006.01)
*H01S 5/20* (2006.01)
*H01S 5/343* (2006.01)
*H01S 5/227* (2006.01)
*H01S 5/065* (2006.01)
*H01S 5/06* (2006.01)
*H01S 5/50* (2006.01)
*H01S 5/10* (2021.01)
*H01S 5/00* (2006.01)

(52) U.S. Cl.
CPC .......... *H01S 5/2022* (2013.01); *H01S 5/0078* (2013.01); *H01S 5/0218* (2013.01); *H01S 5/0612* (2013.01); *H01S 5/0654* (2013.01); *H01S 5/1085* (2013.01); *H01S 5/227* (2013.01); *H01S 5/34306* (2013.01); *H01S 5/50* (2013.01)

(56) References Cited

U.S. PATENT DOCUMENTS

| | | | | |
|---|---|---|---|---|
| 10,281,746 B2 * | 5/2019 | Zheng | ................... | H01S 5/125 |
| 11,239,635 B2 * | 2/2022 | Liu | ................... | G02B 6/12007 |
| 2002/0061032 A1 * | 5/2002 | Miura | ................... | H01S 5/0683 |
| | | | | 372/4 |
| 2003/0043878 A1 * | 3/2003 | Funabashi | ................ | H01S 5/12 |
| | | | | 372/96 |
| 2003/0047738 A1 * | 3/2003 | Funabashi | ................ | H01S 5/12 |
| | | | | 257/79 |
| 2006/0198415 A1 * | 9/2006 | Yamazaki | ............. | G02F 1/0147 |
| | | | | 372/67 |
| 2006/0222039 A1 * | 10/2006 | Yamazaki | ............. | H01S 5/1032 |
| | | | | 372/94 |
| 2007/0189349 A1 * | 8/2007 | Patchell | ................... | H01S 5/12 |
| | | | | 372/49.01 |
| 2008/0025358 A1 * | 1/2008 | Arahira | ............... | H01S 5/06256 |
| | | | | 372/38.02 |
| 2008/0240180 A1 * | 10/2008 | Matsui | ............. | H04B 10/25133 |
| | | | | 372/26 |
| 2009/0060526 A1 * | 3/2009 | Matsui | ............. | H04B 10/25133 |
| | | | | 398/185 |
| 2009/0080484 A1 | 3/2009 | Shigihara | | |
| 2009/0122817 A1 * | 5/2009 | Sato | ................... | G02B 6/12007 |
| | | | | 372/20 |
| 2010/0246612 A1 * | 9/2010 | Shimizu | ................ | H01S 5/0602 |
| | | | | 372/18 |
| 2012/0177075 A1 * | 7/2012 | Koeth | ................... | H01S 5/2022 |
| | | | | 372/44.01 |
| 2015/0280402 A1 * | 10/2015 | Gubenko | ............. | H01S 5/0202 |
| | | | | 372/50.11 |
| 2016/0049767 A1 * | 2/2016 | Morton | ................... | H01S 5/142 |
| | | | | 372/99 |
| 2016/0156149 A1 * | 6/2016 | Takabayashi | ........... | H01S 5/142 |
| | | | | 372/6 |
| 2018/0026426 A1 * | 1/2018 | Kawakita | ............... | G02B 5/284 |
| | | | | 372/20 |
| 2020/0136353 A1 * | 4/2020 | Ryvkin | ................. | H01S 5/3213 |

FOREIGN PATENT DOCUMENTS

| | | | | | |
|---|---|---|---|---|---|
| JP | 2004047638 A | * | 2/2004 | ......... | H01S 5/06256 |
| JP | 2007220692 A | | 8/2007 | | |
| JP | 2008060445 A | * | 3/2008 | .......... | H01S 5/0612 |
| JP | 2009152553 A | * | 7/2009 | ............. | B82Y 20/00 |
| TW | 200537773 A | * | 11/2005 | ......... | G02B 6/12004 |
| WO | WO-2020148656 A1 | * | 7/2020 | .......... | H01S 5/0612 |

OTHER PUBLICATIONS

European Search Report from corresponding European Application No. 21183688.7 dated Nov. 25, 2021.

* cited by examiner

SIDE MODE SUPPRESSION FOR EXTENDED C-BAND TUNABLE LASER

BACKGROUND OF THE INVENTION

The present invention relates to optical telecommunication techniques. More particularly, the present invention provides a method of suppressing side modes for a wavelength tunable laser based on reflective semiconductor optical amplifier with extended C-band, a gain chip of a reflective semiconductor optical amplifier for tunable laser over extended C-band with side mode suppression, and a wavelength tunable laser having the same.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

40-Gbit/s and then 100-Gbit/s data rates wide-band DWDM (Dense Wavelength Division Multiplexed) optical transmission over existing single-mode fiber is a target for the next generation of fiber-optic communication networks. Chip-scale wide-band wavelength-tunable lasers have been of interest for many applications such as wide-band DWDM communication and wavelength-steered light detection and ranging (LIDAR) sensing. More recently, optical components are being integrated on silicon (Si) substrates for fabricating large-scale photonic integrated circuits that co-exist with micro-electronic chips. a whole range of photonic components, including filters, (de)multiplexers, splitters, modulators, and photodetectors, have been demonstrated, mostly in the silicon-on-insulator (SOI) platform. The SOI platform is especially suited for standard WDM communication bands at 1300 nm and 1550 nm, as silicon (n=3.48) and its oxide $SiO_2$ (n=1.44) are both transparent, and form high-index contrast, high-confinement waveguides ideally suited for medium to high-integration silicon photonics integrated circuits (SPICs).

Wavelength tunable semiconductor lasers in silicon photonics platform have been implemented as key elements for many applications of wide-band optical fiber communication with increasing spectral efficiency. A variety of spectrally efficient modulation formats such as phase shift keying (PSK) and quadrature amplitude modulation (QAM) without relying upon a rather complicated optical phase-locked loop. However, technical challenges exist, such as making the Vernier rings of tunable filter in small size under silicon photonics platform for enlarging the free-spectral-range with sufficient side-mode suppression ratio in extended wide-band wavelength-tunable lasers based on reflective semiconductor optical amplifier. Therefore, improved techniques and methods are desired.

BRIEF SUMMARY OF THE INVENTION

The present invention relates to optical telecommunication techniques. More particularly, the present invention provides a method for suppression side-mode of interference spectrum of a wavelength tunable laser over extended C-band, a gain chip of a reflective semiconductor optical amplifier configured to lase out of a high-reflection (HR) facet with decreasing-reflectivity for suppressing long-wavelength side mode and a modified gain curve with extra loss for suppressing short-wavelength side mode, a wavelength-tunable laser with a Vernier-ring-reflector tuner for tuning laser emitted from the same gain chip with light wavelengths over the extended C-band, though other applications are possible.

In an embodiment, the present invention provides a method for improving wide-band wavelength-tunable laser. The method includes configuring a gain chip lengthwise a gain region between a first facet and a second facet and crosswise a PN-junction with an active layer between P-type cladding layer and N-type cladding layer. The method further includes coupling a light excited in the active layer and at least partially reflected from the second facet to pass through the first facet to a wavelength tuner configured to generate a joint interference spectrum with multiple modes in isolated spectral peaks separated by a joint-free-spectral-range (JFSR). Additionally, the method includes configuring the second facet to have reduced light reflectivity for wavelengths increasing from a basic mode JFSR peak to a long-wavelength side mode JFSR peak. Furthermore, the method includes reconfiguring the gain chip with an absorption layer disposed in the N-type cladding layer near the active layer to induce a gain loss for wavelengths shorter than a longest wavelength associated with a short-wavelength side mode JFSR peak. Moreover, the method includes amplifying the light at the basic mode JFSR peak in the gain chip.

In an alternative embodiment, the present invention provides a gain chip of a reflective semiconductor optical amplifier for a wide-band wavelength tunable laser. The gain chip includes a gain region configured lengthwise as a linear ridge waveguide between a first facet and a second facet and crosswise as a PN-junction of a P-type cladding layer and a N-type cladding layer. The gain chip further includes an active layer formed between the P-type cladding layer and the N-type cladding layer and configured to excite a light. Additionally, the gain chip includes an absorption layer in the N-type cladding layer near the active layer with overlapped energy distribution to introduce extra loss in gain profile of the light for wavelengths shorter than a predetermined value. The gain chip further includes an anti-reflection optical characteristics configured at the first facet. Furthermore, the gain chip includes a partial-reflection optical characteristics configured at the second facet. Moreover, the light excited in the active layer is partially reflected at the second facet and passed through the first facet into a wavelength tuner which generates a joint interference spectrum with multiple modes in isolated spectral peaks separated by a joint-free-spectral-range (JFSR). A basic mode JFSR peak of the multiple modes is tuned over a wide-band of wavelengths by the wavelength tuner and amplified in the gain region before exiting as a laser light while a long-wavelength side mode JFSR peak and a short-wavelength JFSR peak are suppressed.

In yet another alternative embodiment, the present invention provides a wavelength tunable semiconductor laser. The wavelength tunable semiconductor laser includes a gain chip comprising a gain region configured lengthwise as a linear waveguide between a first facet with anti-reflection characteristics and a second facet with low-reflection characteristics having decreased light reflectivities for longer wavelengths and configured crosswise as a PN-junction including an active layer to excite a light between a P-type cladding layer and a N-type cladding layer. The wavelength tunable semiconductor laser further includes an absorption layer formed near the active layer in the N-type cladding layer to introduce extra loss in gain profile for the light in the gain region. Additionally, the wavelength tunable semiconductor laser includes a wavelength tuner formed in a silicon photonics substrate and coupled to the first facet to receive the light partially reflected from the second facet. Furthermore, the wavelength tunable semiconductor laser includes a reflector coupled to the wavelength tuner to reflect the light back to the gain region in an extended cavity to generate a joint interference spectrum with multiple modes separated by a joint free-spectral-range (JFSR). Moreover, the light in multiple modes of JFSR peaks includes a basic mode being tunable by the wavelength tuner in extended C-band from ~1526 nm to ~1568 nm and amplified in the extended cavity before lasing out via the second facet while a high-wavelength side mode being suppressed by the low-reflection characteristics having decreased reflectivity for longer wavelengths provided at the second facet and a short-wavelength side mode being suppressed by extra loss in gain profile introduced by the absorption layer.

In still another alternative embodiment, the present invention provides a wavelength tunable semiconductor laser. The wavelength tunable semiconductor laser includes a first gain chip including a first gain region configured lengthwise as a linear waveguide between a first facet with anti-reflection characteristics and a second facet with high-reflection characteristics but having a dip in light reflectivity for a certain wavelengths longer than high-end of extended C-band and configured crosswise as a PN-junction including an active layer to excite a light between a P-type cladding layer and a N-type cladding layer. The wavelength tunable semiconductor laser further includes an absorption layer formed near the active layer in the N-type cladding layer to introduce extra loss in gain profile for the light in the first gain region. Additionally, the wavelength tunable semiconductor laser includes a wavelength tuner formed in a silicon photonics substrate and coupled to the first facet to receive the light reflected from the second facet, forming an extended cavity with the second facet in the first gain region to generate a joint interference spectrum with multiple modes separated by a joint free-spectral-range (JFSR). The wavelength tuner is configured to tune wavelength of a basic mode in the multiple modes of JFSR peaks while a high-wavelength side mode being suppressed by the low-reflection characteristics having decreased reflectivity for longer wavelengths provided at the second facet and a short-wavelength side mode being suppressed by extra loss in gain profile introduced by the absorption layer. Furthermore, the wavelength tunable semiconductor laser includes a wavelength locker coupled to the wavelength tuner to receive the light with the wavelength of the basic mode tuned by the wavelength tuner in extended C-band from ~1526 nm to ~1568 nm and to fine-tune and lock the wavelength. Moreover, the wavelength tunable semiconductor laser includes a lasing exit port coupled to the wavelength locker more distal to the first gain chip to lase out the light with the wavelength. Optionally, the lasing exit port is coupled to a facet of a second gain chip of semiconductor optical amplifier coupled to the wavelength locker.

The present invention achieves these benefits and others in the context of known technology of wavelength-tunable laser with a wavelength tuner, optionally including a reflector, wavelength locker, and a semiconductor optical amplifier. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention relates to optical telecommunication techniques. More particularly, the present invention provides a method for suppression side-modes of interference spectrum of a wavelength tunable laser over extended C-band, a gain chip of a reflective semiconductor optical amplifier configured to lase out of a high-reflection (HR) facet with decreasing-reflectivity for suppressing long-wavelength side mode and a modified gain curve with extra loss for suppressing short-wavelength side mode, a wavelength-tunable laser with a Vernier-ring-reflector tuner for tuning laser emitted from the same gain chip with light wavelengths over the extended C-band, though other applications are possible.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels inner, outer, left, right, front, back, top, bottom, end, forward, reverse, clockwise and counter clockwise have been used for convenience purposes only and are not intended to imply any particular fixed direction. Instead, they are used to reflect relative locations and/or directions between various portions of an object.

Figure 1:
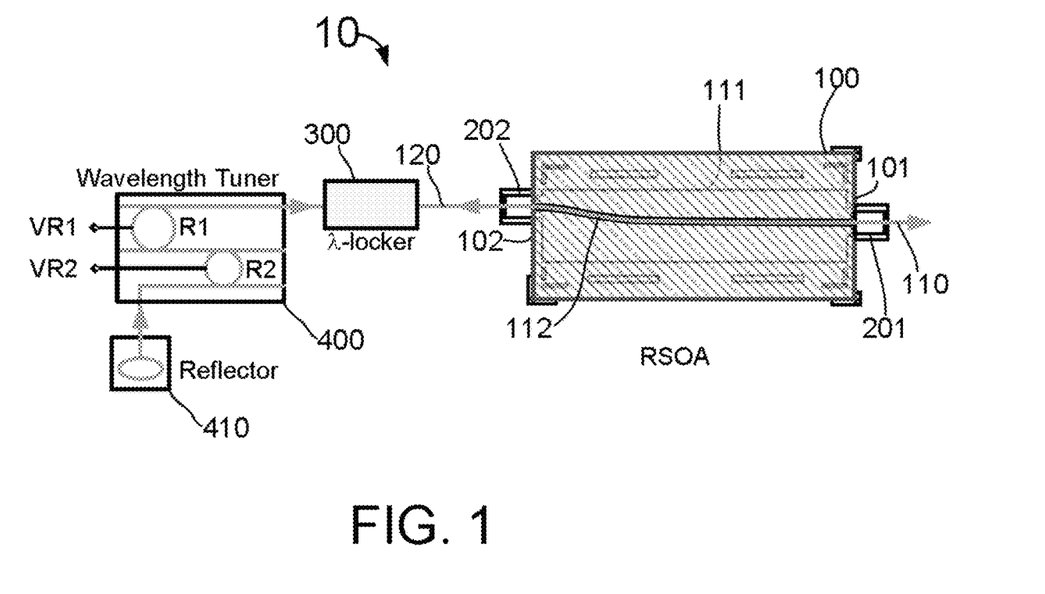
FIG. 1 is a schematic diagram of a tunable laser based on reflective semiconductor optical amplifier coupled with a wavelength tuner plus a reflector according to an embodiment of the present invention.

In an aspect, the present disclosure provides a method of improving wavelength tunable laser performance over extended wide band for various communication applications. The tunable laser 10, in an embodiment as shown in FIG. 1, is provided with a laser flip-chip 100 coupled to a wavelength tuner 400 plus a reflector 410 and a wavelength locker 300. The laser flip-chip 100 is bonded to a silicon photonics substrate, including a gain chip 111 with gain region 112 with a PN junction diode crosswise in a linear waveguide lengthwise configured as a reflective semiconductor optical amplifier (RSOA). In particular, the gain region 112 of the RSOA includes a lasing cavity along the linear waveguide between an anti-reflection (AR) facet 102 and a high-reflection (HR) facet 101. A light can be excited from an active layer in the PN junction. In an embodiment, the light excited in the active layer can be amplified in the lasing cavity with high-reflectivity at the HR facet 101 before exiting the AR facet 102. For tunable laser with normal gain chip in RSOA configuration, the light out of the AR facet 102 enters a wavelength tuner 400 plus a wavelength locker 300. A laser with tuned wavelength eventually exits an exit port which is more distal to the HR facet 101. In an alternative embodiment shown in FIG. 1, unlike normal gain chip in RSOA configuration used primarily as a reflector, the gain chip 111 in RSOA+ configuration is designed to configure the HR facet 101 to a partial reflective and partial transmissive and to serve as an laser exit port, after the light being tuned by the wavelength tuner 400 coupled to the AR facet 102. The HR facet is named after a traditional terminology for the high-reflection facet of RSOA. while the HR facet 101 for gain chip 111 in RSOA+ configuration may be set to a relatively low (<30%) value.

Figure 2:
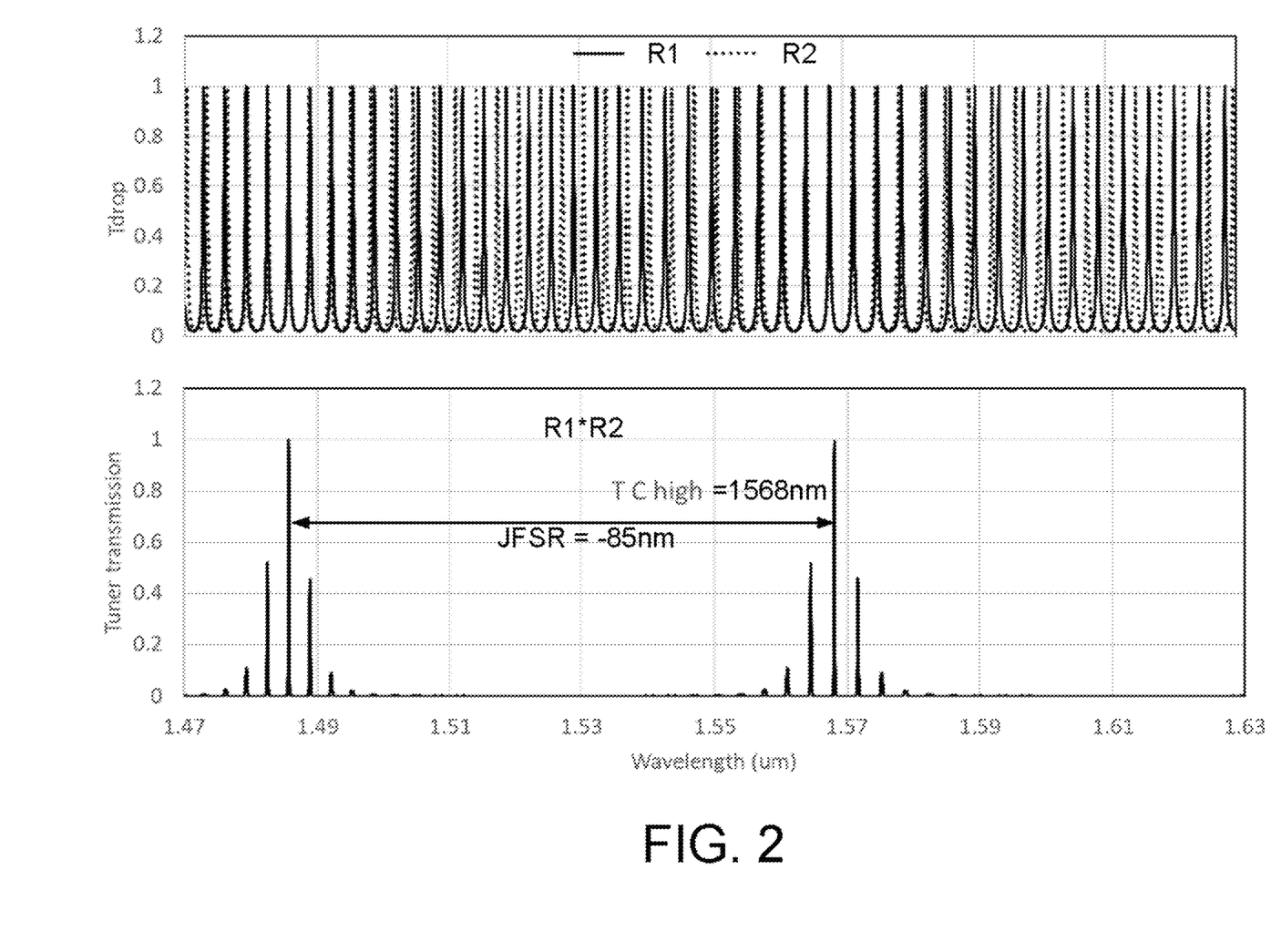
FIG. 2 shows a diagram of individual and joint reflection spectrum from a wavelength tuner based on two Vernier rings coupled with a reflector according to an embodiment of the present invention.

In a specific embodiment of the tunable laser 10 based on the flip-chip of RSOA+100, the HR facet 101 is configured with average only about 5% reflectivity over the extended C-band from about 1526 nm to 1568 nm while with relatively high transmissivity to serve as an exit port for outputting the laser light. The AR facet 102 still allows high 99.99% light transmissivity so that the light excited in the active region 112 can be easily coupled via a coupler 202 into a waveguide 120 into the wavelength tuner 400 formed in a silicon photonics substrate. The wavelength tuner 400, in a specific embodiment, is provided as a Vernier-ring tuner including at least two ring-shaped waveguides, e.g., a ring resonator R1 and a ring resonator R2, formed in the silicon photonics substrate. Each ring resonator, R1 or R2, in an extended cavity in association with the reflector 410 provides a reflection spectrum in an extended cavity between the reflector 410 and the HR facet 101 of the gain chip 111 with multiple resonant peaks (as shown in upper part of FIG. 2) over a wide wavelength range from 1520 nm to 1620 nm. Optionally, the reflector 410 is a reflective waveguide mirror provided >95% reflectivity to a wide band of light. The wavelength spacing between multiple resonant peaks depends on respective ring diameter and optical index of the media material used to form the ring-shaped waveguides. In the extended cavity associated with the combination of the wavelength tuner 400 and the reflector 410, the two reflected spectra generates a joint interference spectrum (referred as R1*R2) in the same wavelength range, as shown in bottom part of FIG. 2. The joint interference spectrum is characterized by multiple resonant peaks or so-called modes with a joint-free-spectral-range (JFSR) as a wavelength spacing between two neighbor major interference JFSR peaks. The value of JFSR is depended on the ring diameters of the two ring-shaped waveguides.

In an embodiment, the wavelength tuner 400 for wide-band tunable laser is preferred to be designed to make JFSR much bigger than a desired tunable range to allow a basic mode JFSR peak to pass while letting nearest side mode JFSR peaks suppressed. In an example, the JFSR is made to be as large as 85 nm for a proposed wavelength tuning in extended C-band from 1526 nm to 1568 nm. With JFSR being set to 85 nm, for a basic mode JFSR peak at a first wavelength of about 1526 nm, a corresponding nearest long-wavelength side mode JFSR peak will be found at a second wavelength of about 1611 nm. For the basic mode JFSR peak at a first wavelength of about 1568 nm, a corresponding nearest short-wavelength side mode JFSR peak can be found at a second wavelength of about 1483 nm. Both the long-waveguide side mode and the short-wavelength side mode are preferred to be substantially suppressed to improve the performance of the wide-band tunable laser 10. Optionally, the wavelength tuner 400 can be provided as a dual-Etalon filter to pass the basic mode JFSR peak only and use a reflector to reflect it back to the gain chip.

In principle, the wavelength tuner plus reflector configuration acts as a wavelength selective filter or wavelength tuner to introduce a returning tuner transmission with the joint interference spectrum back to the gain chip 111. The returning tuner transmission contained the base mode JFSR peak and all side mode JFSR peaks can be reshaped in the gain chip 111 to eliminate or at least suppress all side modes. In an embodiment, the wavelength tunable laser for extended C-band is configured by implementing the gain chip 111 in RSOA+ configuration with laser exiting out of the HR facet. The basic mode JFSR peak may be tuned from a low-end wavelength, C_low=1526 nm, to a high-end wavelength, C_high=1568 nm. When the base mode is tuned to C_low, mostly the long-wavelength side mode of JFSR peak at ~1611 nm should be suppressed in the returning transmission to avoid its inclusion in the exiting laser. While the base mode is tuned to C_high, mostly the short-wavelength side mode of JFSR peaks should be suppressed to improve performance of the tunable laser. If side mode lasing is properly suppressed, the basic mode JFSR peak can reshape the center or optima position of the gain profile to determine a laser emission of a sharp peak with a single wavelength. While the wavelength corresponding to the basic mode JFSR peak can be tunable based on design of the wavelength tuner plus reflector configuration through changing optical index of each waveguide therein by changing temperature thereof. For example, the basic mode JFSR peak is initially set to a certain wavelength by setting the optimal temperatures using pre-calibrated voltages supplied to the resistive heaters associated with the two resonator R1 and R2. As shown in FIG. 1, the pre-calibrated voltages VR1 and VR2 can be stored in a look-up-table of a memory, which can be read every time for initialing the silicon photonics based tunable laser device. Coarse wavelength tuning can be achieved by changing temperatures around the two ring resonators R1 and the R2 to tune the wavelength in an extended tunable range around the optimal gain profile position. The temperature changes are controlled using electrical heaters (not shown) driven by the applied voltages VR1 and VR2. Additionally, fine wavelength tuning can be done by changing temperature around the wavelength locker 300.

Figure 3:
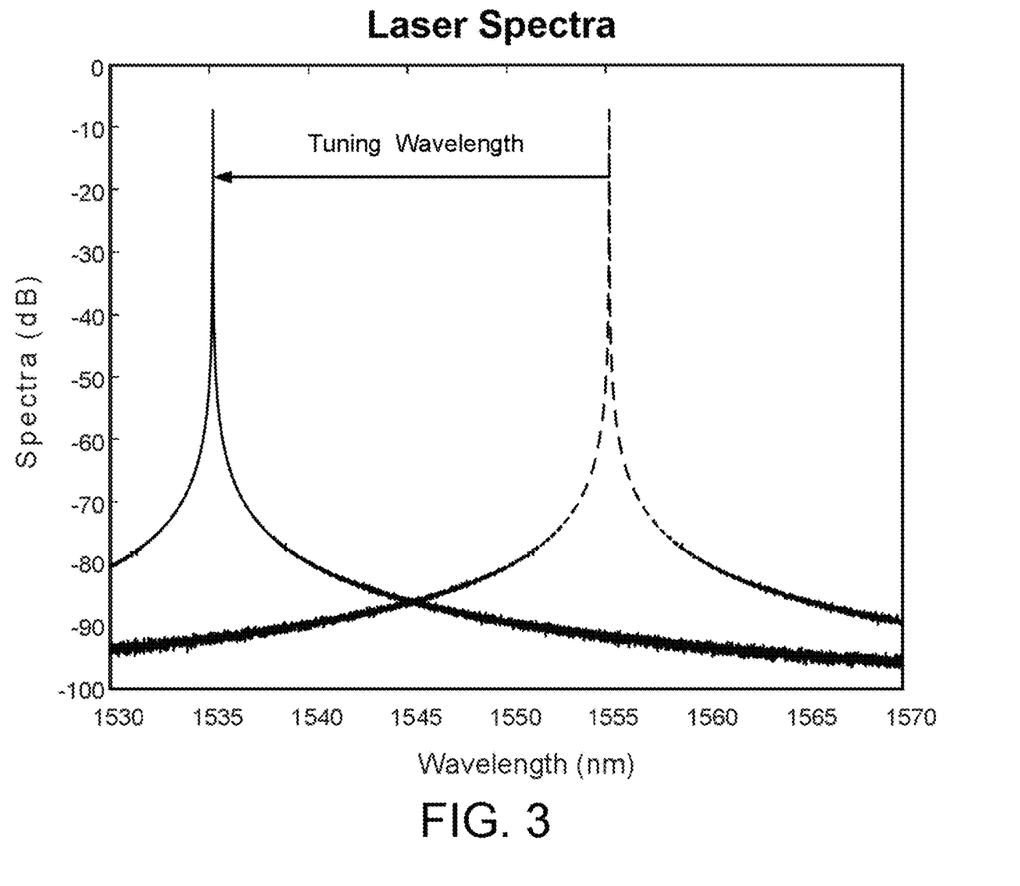
FIG. 3 is an exemplary plot of laser spectra with a tunable wavelength in C-band according to an embodiment of the present invention.

FIG. 3 is an exemplary diagram of laser spectra outputted by the tunable laser with laser wavelength being tuned according to an embodiment of the present invention. As shown, the laser emission wavelength is given by the peak position of the spectra which is reshaped by superimposing a basic mode JFSR peak with the gain profile of laser emission. In the example, the laser emission wavelength is tuned from 1555 nm to 1535 nm. For wide-band wavelength tuning, it is preferred to have the JFSR designed for the tunable laser as wide as possible to achieve better mode selectivity to have a strong single-wavelength light emission at the basic mode while minimized interference at side modes. But to achieve a wide JFSR in the Vernier rings requires a very small diameter for the ring resonator and more complicated waveguide structures to be formed in the silicon photonics substrate to achieve mode selection/suppression and stability. Designing and building ring resonators with super small diameters or adding additional element for improving mode selection on the silicon photonics substrate is technically challenging while economically unfavorable in many ways.

Figure 4:
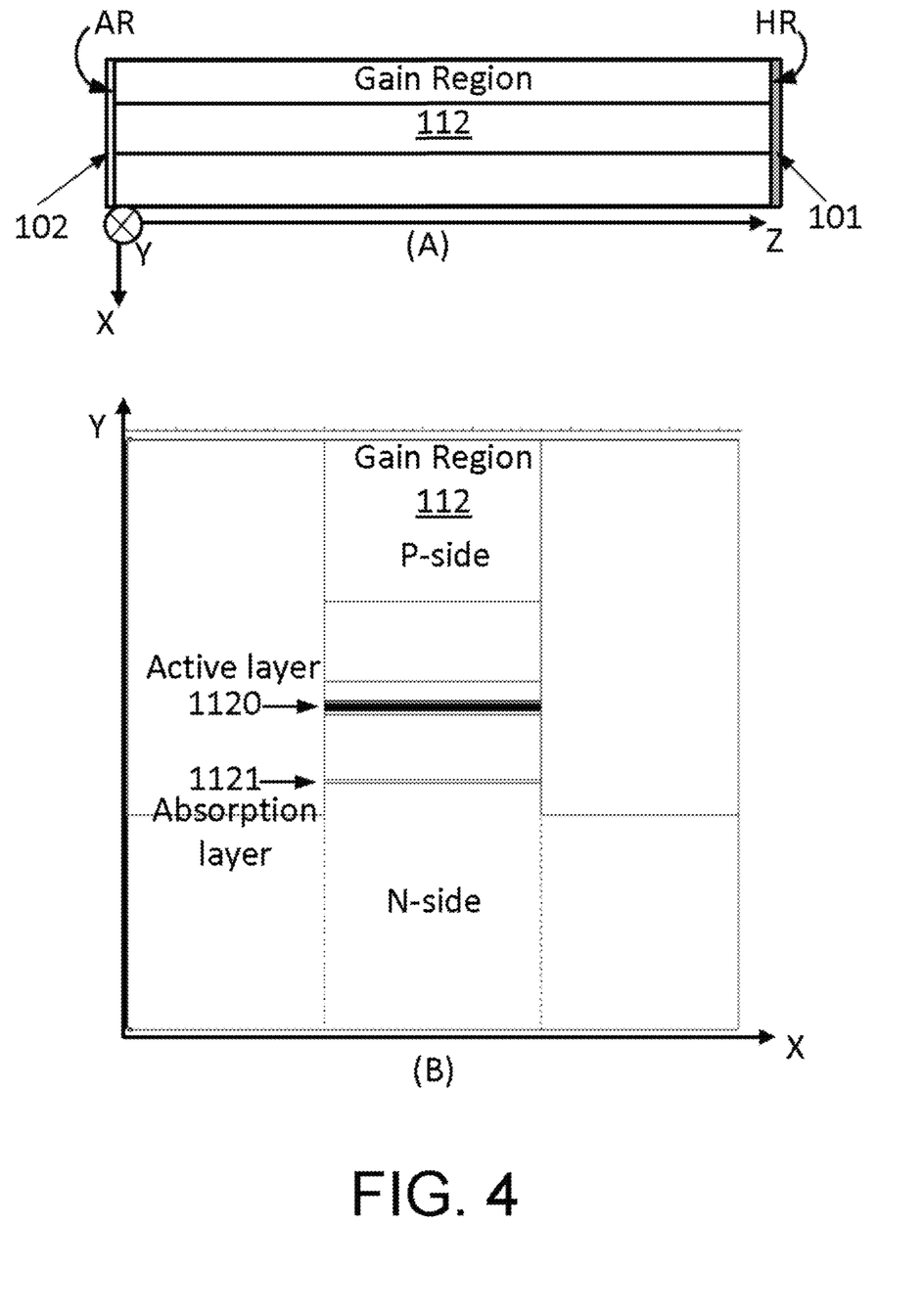
FIG. 4 is a simplified diagram of (A) a top view of a gain region with a high-reflection (HR) facet and an anti-reflection (AR) facet and (B) a cross-section view of the gain region with active layer and absorption layer according to an embodiment of the present invention.

In an aspect, the present invention provides a method for improving basic mode wavelength selection of tunable laser emission out of extended C-band from a gain chip of RSOA coupled with a wavelength tuner plus a reflector by suppressing both short- and long-wavelength side mode JFSR peaks. The method is based on reconfiguration of the gain chip by modifying light reflectivity at the HR facet and modifying light absorption. FIG. 4 is a simplified diagram of (A) a top view of a gain region with a HR facet and an AR facet and (B) a cross-section view of the gain region with an active layer and an absorption layer according to an embodiment of the present invention. This diagram is merely an example, which should not unduly limit the scope of the claims. One of ordinary skill in the art would recognize many variations, alternatives, and modifications. Referring to part (A) of FIG. 4 and also referring to FIG. 1, the gain region 112 of the gain chip 111 of RSOA+ 100 is configured lengthwise (in Z-direction) a linear waveguide with the HR facet 101 and the AR facet 102. The AR facet 102, namely, is made to be an anti-reflection optical characteristics with light transmissivity being set to be 99.99% or higher for passing the light in a wide wavelength range. In particular, the light excited in the gain region is easily passed through the AR facet and a coupler 202 at an edge of the gain chip 111 into a waveguide 120 in a silicon photonics substrate (see FIG. 1). Further, the light in the waveguide is led to a wavelength tuner plus reflector configuration formed in the same silicon photonics substrate. The HR facet 101, in an embodiment, is provided with a partial-reflection optical characteristics. On the one hand, the partial-reflection optical characteristics optionally provides a low reflectivity (<30%) to reflect the light excited in the gain chip towards the AR facet in RSOA+ configuration. Optionally, for the gain chip of RSOA+ is applied for tunable laser with the wavelengths tunable over C-band, the low-reflectivity is set to <10%. On the other hand, the partial-reflection optical characteristics provides high transmission rate for exiting a laser generated in the extended cavity of the RSOA+ associated with the wavelength tuner and the reflector with a wavelength locked by a wavelength locker.

Additionally, the partial-reflection optical characteristics includes a feature of wavelength dependence of the light reflectivity. In a preferred embodiment, light reflectivity is configured to monotonically decrease with increasing wavelength. In an example, the light reflectivity decreases monotonically from ~10% at about 1483 nm to <4% at about 1568 nm. Optionally, a tilted AR coating applied to the HR facet can achieve this feature. Optionally, the coating is made in a single layer or tri-layer structure from one selected from $Al_2O_3$, $Ta_2O_5$, Si, $SiO_2$, or a combination of those materials. As the joint interference spectrum generated in the extended cavity of the RSOA+ associated with the wavelength tuner and the reflector, a lower reflectivity at the HR facet for the light of longer wavelengths provides a natural suppression to a long-wavelength side mode JFSR peak in the joint interference spectrum returned to the gain chip. The long-wavelength side mode JFSR suppression is particularly beneficial for the wavelength tunable laser to tune the basic mode to the low-end of the extended C-band.

Optionally, the HR facet is configured to provide the partial-reflection optical characteristics with high-reflectivity to light of wavelengths over the C-band while with a reflectivity dip (<50%) for wavelengths around the long-wavelength side mode JFSR peak. This HR facet configuration of the gain chip of RSOA may be implemented in a wavelength tunable laser with the laser exit port at other end of the wavelength tuner more distal to the HR facet of the gain chip of RSOA. Optionally, the exit port is at one facet of another semiconductor optical amplifier (SOA). More details can be found in FIG. 8 and associated descriptions below.

Referring to part (B) of FIG. 4, it is a schematic diagram of a cross-section view of the gain region 112 which is configured crosswise a PN-junction diode in the XY-plane with an active layer 1120 sandwiched by a P-type semiconductor material and a N-type semiconductor material. Optionally, both the P-type semiconductor material and the N-type semiconductor material are Indium Phosphide (InP) material with different electrical dopants. The cross-section of the PN-junction is provided as a ridge structure over a wider base. The P-type semiconductor material is forming a P-type cladding layer on top of the N-type semiconductor material as a N-type cladding layer in the ridge structure along vertical Y-direction. The N-type cladding layer has a base portion wider than the ridge portion in horizontal X-direction. Optionally, the active layer 1120 is a strained-layer quantum well structure made from InGaAs, or InGaAsP, or AlGaInAs. In general, the active layer 1120 is designated to cause light emission within a confined space of the PN-junction to induce a laser having its light energy amplified in the lasing cavity of the gain region 112 with a gain value corresponding to a certain wavelength. For the tunable laser with light wavelength tuned across the extended C-band, a normal gain profile is obtained by plotting the gain values as functions of the laser wavelengths.

In the embodiment, the gain chip is reconfigured by placing an absorption layer 1121 near the active layer 1120 to provide a designated extra loss to at least part of the normal gain profile. In particular, the absorption layer 1121 is intended to introduce a loss in gain profile for short-wavelengths for suppressing short-wavelength side mode JFSR peak to enhance lasing at basic mode JFSR peak. Especially, when the basic mode wavelength is tuned by the wavelength tuner to a high-end of the extended C-band, a nearest short-wavelength side mode JFSR peak is fairly close to the low-end of the extended C-band and should be properly suppressed. Optionally, the absorption layer 1121 is disposed in the N-type cladding layer near the active layer 1120 as N-type side of the PN-junction has lower free carrier absorption loss. Optionally, the absorption layer 1121 is configured to absorb light with wavelengths shorter than a predetermined value (e.g., 1490 nm or shorter) which may be a longest wavelength associated with the short-wavelength side mode JFSR peak. Optionally, the absorption layer 1121 is made from a layer of GaInAsP or AlGaInAs semiconductor material with a band gap lower than the wavelength (~1483 nm) of the short-wavelength side mode JFSR peak, aiming to suppress the short-wavelength side mode JFSR peak by filtering it and shorter wavelengths out in the joint interference spectrum.

Optionally, the gain chip reconfiguration to provide an absorption layer to introduce extra gain loss for designated short wavelengths is applicable to a gain chip in RSOA+ configuration for wavelength tunable laser with the lasing exit at the HR facet. Optionally, the above gain chip reconfiguration is also applicable to s gain chip in RSOA configuration for wavelength tunable laser with a lasing exit port at other end of the wavelength tuner more distal to the gain chip of RSOA. Optionally, the lasing exit port is associated with another gain chip in semiconductor optical amplifier (SOA) configuration added to the other end of the wavelength tuner and a wavelength locker (see FIG. 8).

Figure 5:
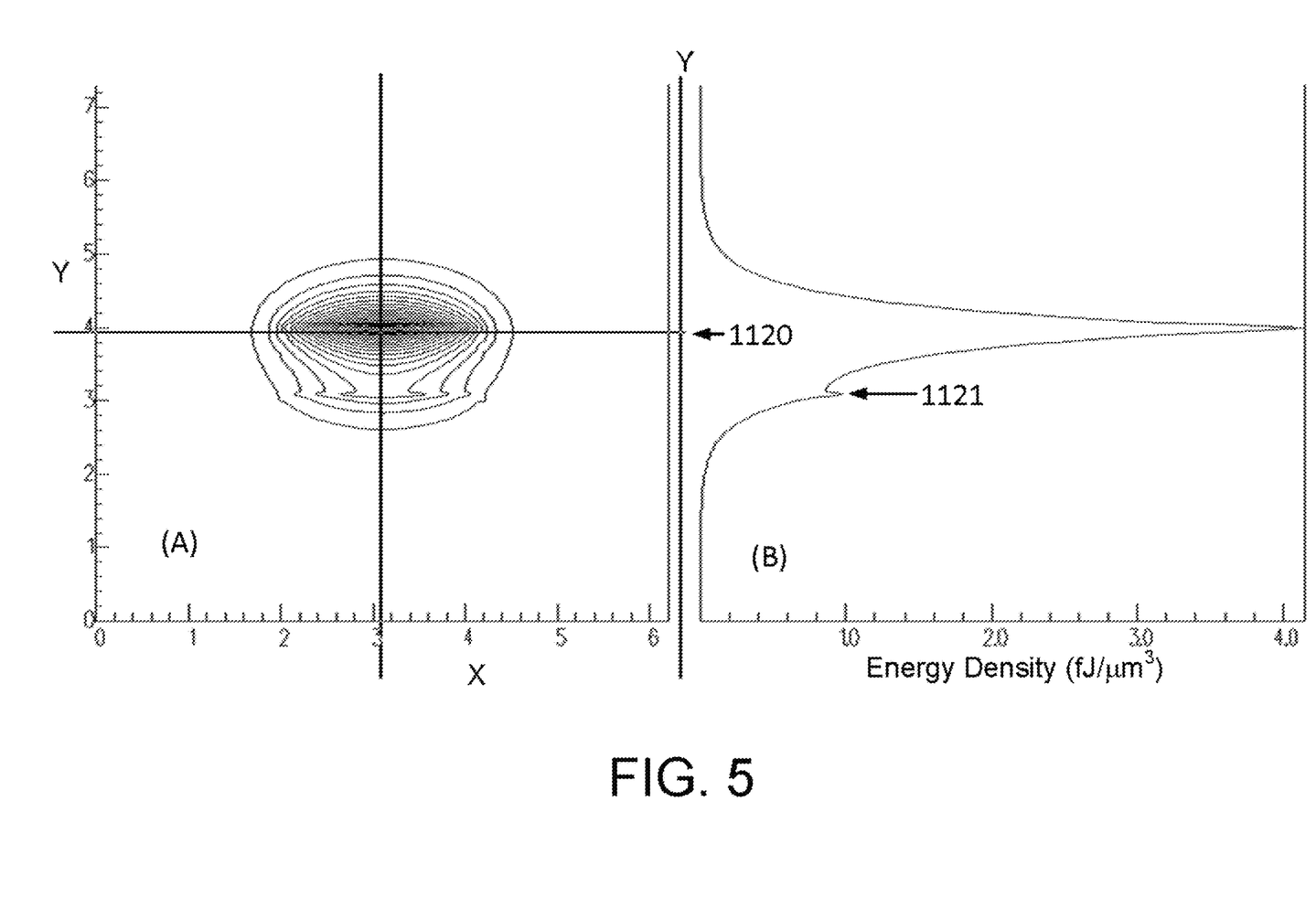
FIG. 5 is a plot of (A) a cross-section view of spatial distribution of the energy density around an active layer of the gain region of FIG. 4 and (B) a vertical distribution of the energy density along Y direction crossing the active layer of the gain region according to an embodiment of the present invention.

FIG. 5 is a plot of (A) a cross-section view of spatial distribution of the energy density around an active layer of the gain region of FIG. 4 and (B) a vertical distribution of the energy density along the Y direction crossing the active layer according to an embodiment of the present invention. This diagram is merely a plot of the energy distribution for an exemplary design of a reconfigured gain chip. As shown in part (A) of FIG. 5, a central plane of the distribution is along the active layer 1120 of the gain region. Since the index of refraction of the active layer 1120 is always much higher than the surrounding cladding layer in InP material, optical focal effect causes a fundamental mode of light emitted from the active layer be confined thereof with high energy density. As shown in part (A) of FIG. 5, the high energy density is mainly distributed around the central plane of the active layer 1120 along the X-direction and extended to a narrow range of about ±2 µm above or below the active layer 1120 in the Y-direction. Referring to part (A) of FIG. 5, in an embodiment, the absorption layer 1121 is disposed near the active layer 1120 to effectively cause modification to the energy distribution as mentioned above. In a specific embodiment, the absorption layer 1121 is disposed in the N-type cladding layer near the active layer 1120 within 2 µm range in the Y-direction. The absorption layer 1121 needs to be significantly overlapped with the fundamental mode of active layer 1120 to effectively play a role to modify the gain profile. Optionally, the absorption layer 1121 is designed to be in a preferred mode-overlap range around 20-30% confinement factor of the quantum well associated with the active layer 1120. As a result, the spatial distribution of the energy density in the gain region is altered to become less symmetric relative to the central plane around the active layer.

Further as shown in part (B) of FIG. 5, a sharp major peak in in the vertical distribution of the energy density indicates that the fundamental mode of the light emission from the active layer in the gain region is primarily confined around the central plane along X-direction due to the optical focal effect caused by high index of refraction of the active layer relative to low index of refraction of the cladding layer above or below. But the absorption layer, which is also relatively high in its index of refraction compared to nearby cladding layer with InP material, also generates a minor peak overlapped within the tail portion of the major peak. Thus, the absorption layer 1121 as disposed with significant energy distribution overlapping with the active layer has sufficiently exposure to the light emission from the active layer so that sufficient amount of light can be subject to absorption by the absorption layer. Additionally, the nature of light absorption is depended on the bandgap designed for the absorption layer. In an embodiment, the bandgap of the absorption layer is set to be lower than a predetermined wavelength so that any light with wavelengths shorter than the predetermined wavelength value (e.g., 1490 nm) can be mostly absorbed by the absorption layer to modify the gain profile of the gain chip of RSOA+ in the corresponding wavelength range.

Figure 6:
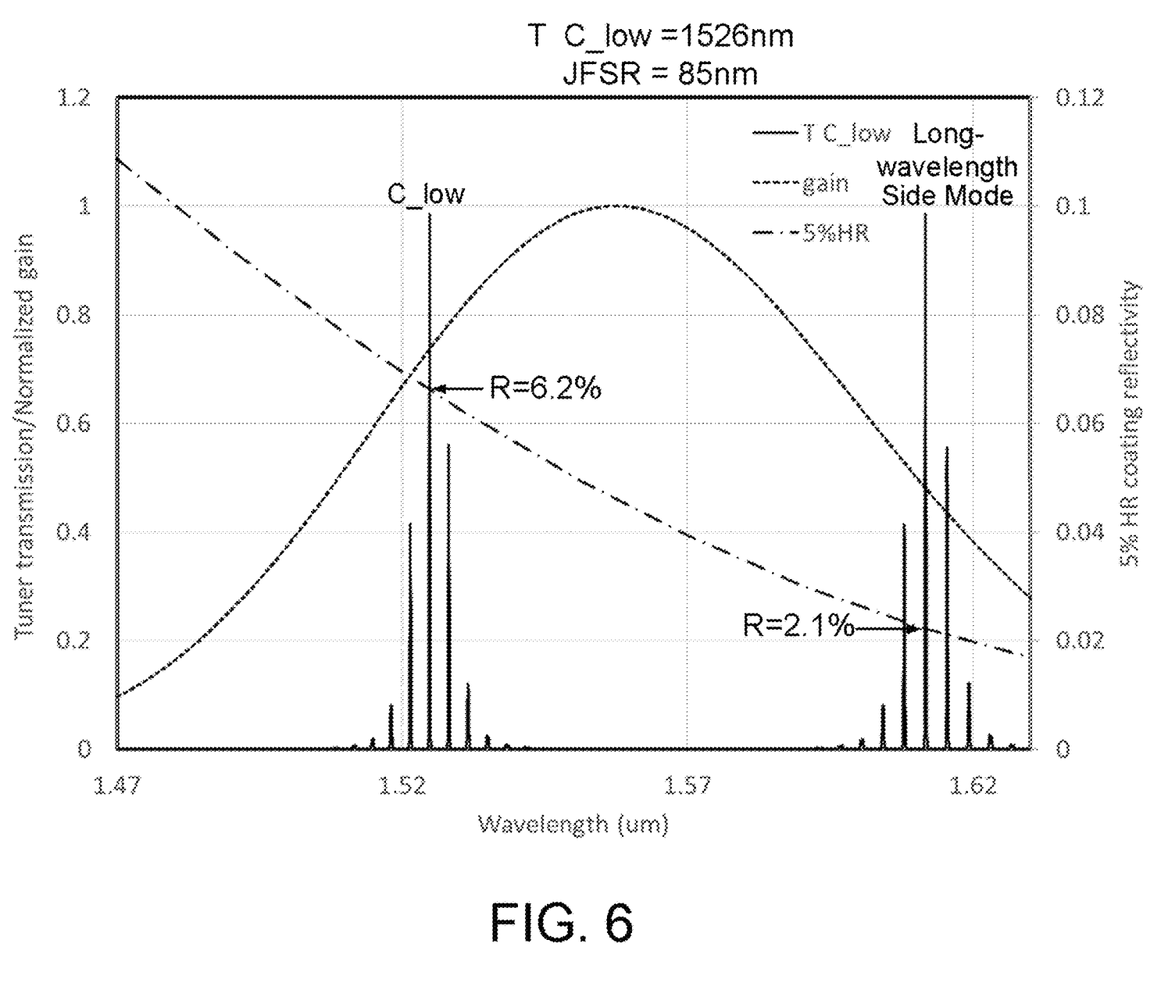
FIG. 6 shows exemplary plots of 1) tuner transmission with JFSR=85 nm and basic mode at low-end of C-band (about 1526 nm), 2) gain profile of laser in the gain region of RSOA+, and 3) reflectivity curve generated by HR-facet coating according to a specific embodiment of the present invention.

FIG. 6 shows exemplary plots of 1) tuner transmission with JFSR=85 nm and basic mode at low-end of C-band (~1526 nm), 2) gain profile of laser emission of RSOA+, and 3) reflectivity curve generated by HR-facet coating according to a specific embodiment of the present invention. This diagram is merely an example, which should not unduly limit the scope of the claims. One of ordinary skill in the art would recognize many variations, alternatives, and modifications. In the example, under a specific wavelength tuner design with a joint-free-spectral-range (JFSR) of a joint interference spectrum being provided at 85 nm, the joint interference spectrum can include a basic mode JFSR peak tunable in the extended C-band and several side modes JFSR peaks nearby. As the basic mode JFSR peak is tuned to be 1526 nm at about the low-end of the extended C-band (C_low), referring to FIG. 6, a long-wavelength side mode JFSR peak will appear at about 1611 nm. A gain profile (represented by dashed line) over the same wavelength range for an exemplary gain chip design has a fairly flat and wide gain range across the extended C-band with a peak around 1540 nm and relatively reduced (but still >50% of the peak value) gain values towards the basic mode JFSR peak at ~1526 nm and the long-wavelength side mode JFSR peak at ~1611 nm. This means the gain chip can potentially lase at both the basic mode JFSR peak (~1526 nm), which is preferred, and the long-wavelength side mode JFSR peak (~1611 nm), which is unwanted. In this case, a reconfigured gain chip of RSOA+ with a feature for suppressing the unwanted lasing at wavelength of the long-wavelength side mode of JFSR peak would be desired.

In the embodiment of the gain chip of RSOA+ shown in FIG. 4(A), the gain chip in the present invention is configured to have the HR facet be provided with an optical characteristics of monotonically decreasing light reflectivity with increasing wavelength. Referring to FIG. 6, the light reflectivity is monotonically decreased at least from the wavelength of the basic mode JFSR peak location to the wavelength of the long-wavelength side mode JFSR peak location. In the example shown in FIG. 6, the reflectivity curve (represented by dash-dot line) shows that the light reflectivity R=6.2% at the basic mode location ~1526 nm is reduced to 2.1% at the long-wavelength side mode location. This translates to a side-mode suppression ratio (SMSR) of about 3× to allow a sufficient suppression of the long-wavelength side mode JFSR peak to eliminate the unwanted lasing out of the gain chip of RSOA+. For a gain chip of RSOA with high-reflection facet being configured as mere reflector, the high-reflection facet can be configured to give high-reflectivity for light in C-band but a dip in reflectivity for light with wavelengths around the long-wavelength side mode JFSR peak at ~1611 nm to suppress the unwanted side-mode lasing.

Figure 7:
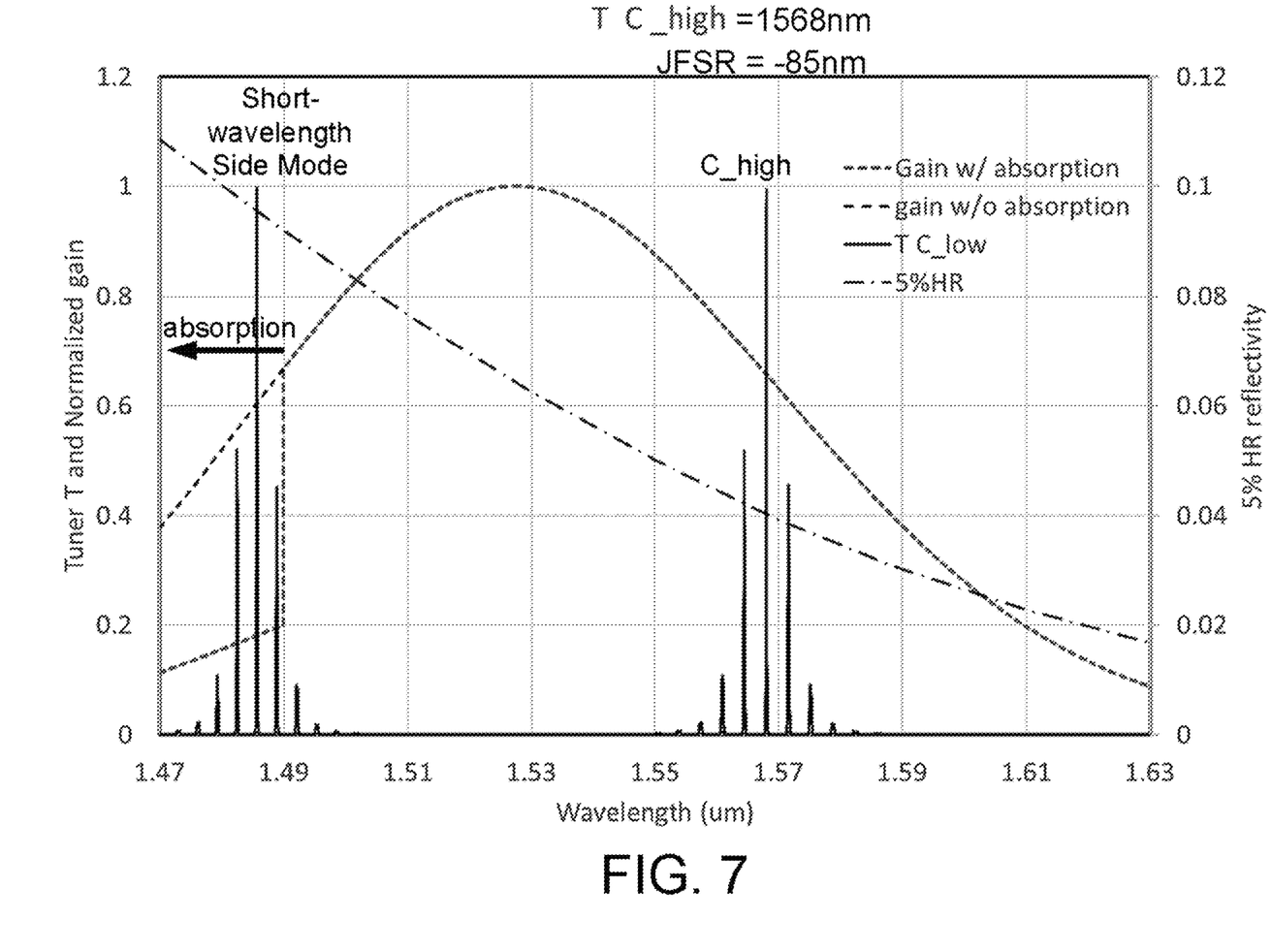
FIG. 7 shows exemplary plots of 1) tuner transmission with JFSR=−85 nm and basic mode at high-end of C-band (about 1568 nm), 2) gain profile of laser in the gain region of RSOA+ with/without absorption of light wavelength <1490 nm, and 3) reflectivity curve generated by HR-facet coating according to another specific embodiment of the present invention.

FIG. 7 shows exemplary plots of 1) tuner transmission with JFSR=85 nm and basic mode at high-end of C-band (~1568 nm), 2) gain profile of laser emission of RSOA+ with/without absorption of light wavelength <1490 nm, and 3) reflectivity curve generated by HR-facet coating according to another specific embodiment of the present invention. This diagram is merely an example, which should not unduly limit the scope of the claims. One of ordinary skill in the art would recognize many variations, alternatives, and modifications. In the example, under the same wavelength tuner design with JFSR being given at 85 nm, the joint interference spectrum generated in the extended cavity associated with the wavelength tuner and the gain chip includes a basic mode JFSR peak tunable up to ~1568 nm at the high-end of the extended C-band (C_high). Referring to FIG. 7, when the basic mode JFSR peak is set at ~1568 nm, a short-wavelength side mode JFSR peak, which is closest side mode relative to the extended C-band, is at about 1483 nm. Also shown in FIG. 7, a gain profile (represented by dashed line) across the same wavelength range is fairly flat with a peak around 1530 nm and relatively lowered gain values (but still >60% of the peak value) towards the basic mode JFSR peak at ~1568 nm and the short-wavelength side mode JFSR peak at ~1483 nm. the gain chip can potentially lase at both the basic mode JFSR peak (~1568 nm), which is preferred, and the short-wavelength side mode JFSR peak (~1483 nm), which is unwanted. In this case, the gain chip of RSOA+ is reconfigured to provide a feature for eliminating side-mode lasing or specifically suppressing the short-wavelength side mode of JFSR peak would be desired. A reflectivity curve (represented by dash-dot line) from the low-reflectivity coating at the HR facet is plotted here but has no effect to suppress short-wavelength side mode as its reflectivity actually is higher at the shorter wavelength.

In the embodiment as shown in FIG. 4(B), the gain chip of RSOA in the present invention is reconfigured with an absorption layer being added in the N-type cladding layer near the active layer to absorb light with wavelengths shorter than a longest wavelength associated with the short-wavelength side mode JFSR peak in the joint interference transmission. Referring to FIG. 6, the gain profile with the absorption layer being added generates significant loss in gain values for wavelengths shorter than 1490 nm, effectively suppressing the short-wavelength side mode JFSR peak at ~1483 nm to eliminate the corresponding side mode lasing.

In another aspect, the present disclosure also provides a gain chip in reflective semiconductor optical amplifier (RSOA) for wavelength tunable laser. Optionally, the gain chip is in a RSOA+ configuration designed to emit laser light from a high-reflection (HR) facet with partial-reflection partial transmissive characteristics and to pass light via an anti-reflection (AR) facet with substantially high transmissivity to a wavelength tuner to tune wavelengths in extended C-band. Optionally, the wavelength tuner is provided as a Vernier-ring tuner having two resonant ring waveguides formed in a silicon photonics substrate. Optionally, the wavelength tuner is provided as a dual-Etalon filter. Optionally, a reflector is included coupling with the wavelength tuner to generate an extended cavity with the HR facet of the gain chip. Optionally, a wavelength locker is added between the wavelength tuner and the gain chip. As described above, the gain chip of RSOA+ includes a gain region configured as a ridge waveguide lengthwise between the AR facet and the HR facet which is used for exiting laser. The gain region is configured as a PN-junction diode crosswise with an active layer in a central plane between a P-type cladding layer and a N-type cladding layer. The AR facet includes an anti-reflection coating to make the light emitted from an active layer in the gain region be able to pass through the AR facet with a transmissivity 99.99% or higher. The HR facet includes a partial-reflective coating, unlike regular high-reflectivity (>90%) coating in gain chip in normal RSOA configuration, to provide low-reflectivity (<10%) to the light emitted from the active layer with wavelengths in extended C-band and provide partial transmissivity to allow laser light amplified by the RSOA+ to exit. Additionally, the gain chip of RSOA+ includes an absorption layer inserted into the N-type cladding layer of the PN-junction diode in the gain region at a overlapping position near quantum well of the active layer. Both the low-reflectivity coating at the HR facet and the absorption layer near the active layer are utilized to modify the gain chip of RSOA+ for suppressing unwanted side mode lasing while allowing desired basic mode lasing with wavelengths tunable over extended C-band.

In an embodiment, the partial-reflective coating at the HR facet is configured to be a tilted anti-reflective coating with decreasing reflectivity monotonically as wavelength increases. Since the wavelength tuner tunes wavelength of the light partially reflected from the HR facet and passed through the AR facet, the joint interference spectrum generated in the extended cavity associated with the wavelength tuner, the reflector, and the gain chip is directly affected by the decreasing reflectivity of the coating at the HR facet. The JFSR peaks appeared in the joint interference spectrum at higher wavelengths are subjected to a suppression by the decreasing reflectivity. For example, for a Vernier-ring-reflector tuner designed with JFSR=85 nm, when the basic mode JFSR peak is tuned in the C-band and amplified as the laser light in the extended cavity, the long-wavelength side mode (a nearest one being at about 1611 nm) can be correspondingly suppressed in the laser out of the RSOA+.

In an embodiment, the absorption layer inserted in the PN junction diode near the active layer within ~4 μm range and 20-30% confinement factor of the active layer quantum well is designated to expose sufficient light energy of the laser emission induced by the active layer and to induce light absorption at least for a corresponding wavelength range. At the same time, the absorption layer is designed with a bandgap smaller than a longest JFSR wavelength that need be filtered associated with a short-wavelength side mode JFSR peak. Therefore, the absorption layer provides extra loss to the gain profile by absorbing light with wavelengths shorter than the longest wavelength associated with short-wavelength side mode JFSR peak in the joint interference spectrum. Optionally, the alteration to the gain profile causes nearly 50% drop in gain value for wavelengths shorter than 1490 nm, substantially suppressing the short-wavelength side mode JFSR peak at ~1483 nm in the laser out of the HR facet RSOA+. Optionally, the similar alteration to the gain profile causes nearly 50% drop in gain value for wavelengths shorter than 1490 nm, substantially suppressing the short-wavelength side mode JFSR peak at ~1483 nm in the laser out of an exit port associated with a gain chip of semiconductor optical amplifier (SOA) located at other end of the wavelength tuner more distal to the gain chip of RSOA+.

In yet another aspect, the present disclosure provides a wide-band wavelength tunable laser based on a gain chip in reflective semiconductor optical amplifier (RSOA+) configuration described herein. The gain chip of RSOA+ has an anti-reflection facet coupled to a wavelength tuner plus a reflector in silicon photonics platform to generate a joint interference spectrum with multiple modes of JFSR peaks separated by joint-free-spectral-range (JFSR). Optionally, the wavelength tuner is provided as a Vernier-ring tuner configured to tune the basic mode JFSR peak over a wide wavelength range, such as extended C-band. Optionally, the wavelength tuner is provided as a dual-Etalon filter configured to pass the basic mode only. The gain chip of RSOA+ also has a high-reflection facet configured as an exit port for laser with wavelengths being tuned by the wavelength tuner over extended C-band. The gain chip of RSOA+ is, as described throughout the specification, provided with a low-reflectivity optical characteristics at the high-reflection facet with decreasing reflectivity as wavelength increases to suppress a nearest long-wavelength side mode JFSR peak in the joint interference spectrum in an extended cavity provided between the reflector and the high-reflection facet. In an example with the JFSR of the wavelength tuner being set to 85 nm, the nearest long-wavelength side mode JFSR peak is located at ~1611 nm as a basic mode JFSR peak is set to a low-end of C-band at ~1526 nm. With the optical characteristics at the high-reflection facet being configured with a reduced reflectivity of about 2.1% at ~1611 nm compared to about 6.2% at ~1568 nm, this long-wavelength side mode JFSR peak at ~1611 nm can be effectively suppressed by at least 3× side-mode suppression ratio (SMSR). Additionally, the gain chip is reconfigured with an absorption layer being disposed to partially overlap with active layer quantum well to alter the gain profile by providing extra loss in short wavelength range for suppressing short-wavelength side mode JFSR peak. In the example with JFSR=85 nm, the nearest short-wavelength side mode JFSR peak is at ~1483 nm as the basic mode JFSR peak is set to a high-end of C-band at ~1568 nm. With the absorption layer being configured to have a bandgap smaller than a predetermined wavelength value, ~1490 nm, the gain for light excited by the active layer with wavelengths shorter than ~1490 nm can be reduced by half due to light absorption by the absorption layer. Therefore, this short-wavelength side mode JFSR peak, whose wavelength is around ~1483 nm<1490 nm, can be substantially suppressed. The wavelength tunable laser thus only lase out a laser with single wavelength at the basic mode JFSR peak, which is tunable in the C-band from 1526 nm to 1568 nm, out of the high-reflection facet of RSOA+.

Figure 8:
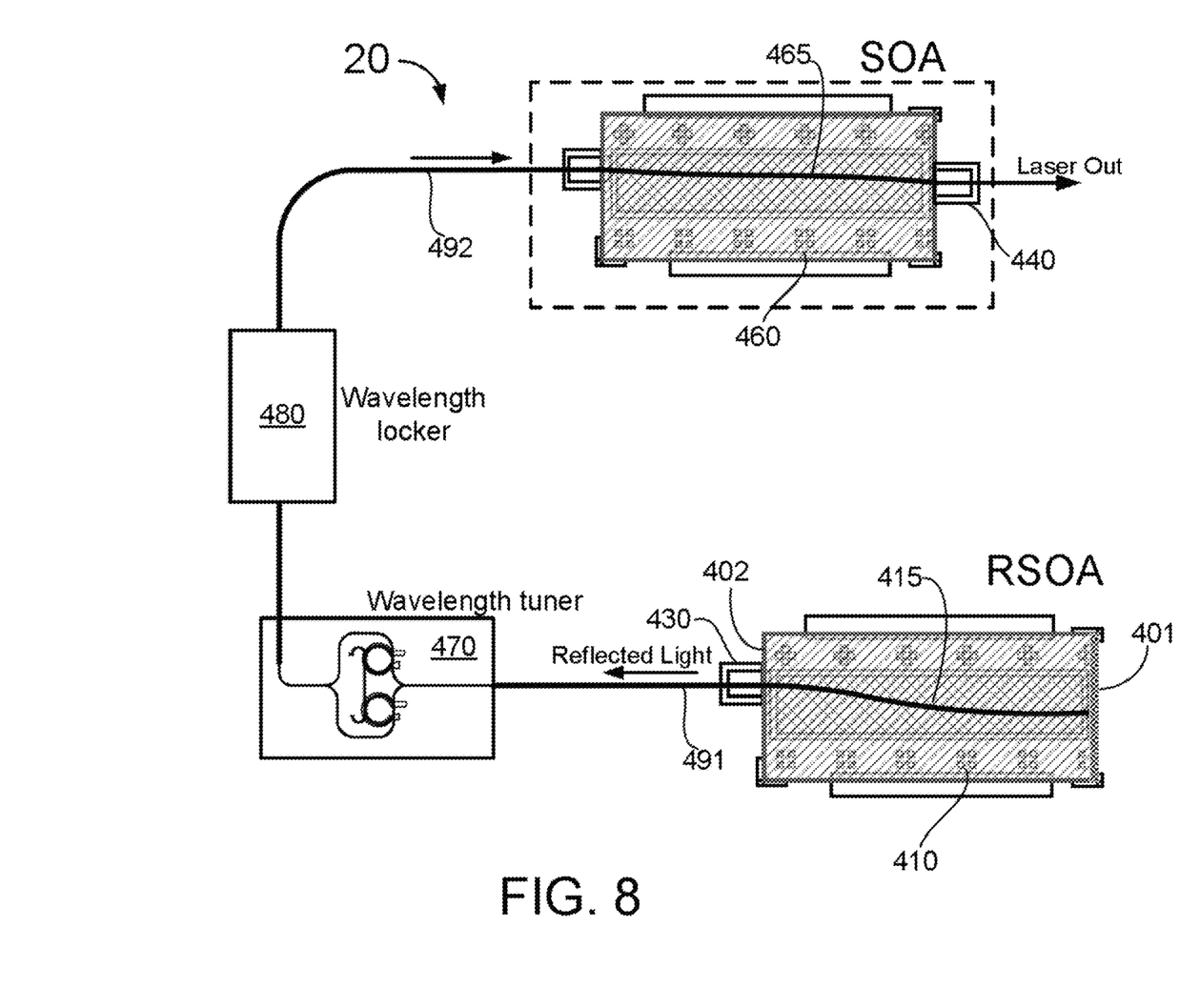
FIG. 8 is a schematic diagram of a tunable laser based on reflective semiconductor optical amplifier with a wavelength tuner and optionally with a semiconductor optical amplifier according to another embodiment of the present invention.

In an alternative embodiment, the present disclosure provides a silicon-photonics-based wide-band wavelength tunable laser that includes a gain chip in reflective semiconductor optical amplifier (RSOA) described herein. FIG. 8 is a diagram of a wavelength tunable semiconductor laser module having the thin-film filter added to a high-reflectivity facet of a gain chip of a reflective semiconductor optical amplifier therein according to an embodiment of the present invention. This diagram is merely an example, which should not unduly limit the scope of the claims. One of ordinary skill in the art would recognize many variations, alternatives, and modifications. As shown, the tunable laser module 20 includes a first laser diode chip 410 flip bonded onto a silicon photonics substrate. The chip 410 has a gain region 415 bounded between a first facet 401 and a second facet 402. The first facet 401 is configured to be a high-reflection facet acted as a reflector to light excited in the gain region 415. The second facet 402 is configured to be anti-reflection characteristics allowing the light excited in the gain region 415 and reflected by the first facet 401 to pass out. The second facet 402 is coupled via an edge coupler 430 to a first waveguide 491 formed in the silicon photonics substrate. The first waveguide 491 is led to a wavelength tuner 470, i.e., a tunable filter, configured to create an extended cavity with the first facet 401 (as a reflector) in the gain region 415 to generate an interference spectrum therein. The interference spectrum is characterized by multiple modes of JFSR peaks separated by joint-free-spectral-range (JFSR). Optionally, the wavelength tuner 470 is provided as a Vernier-ring tuner (as shown in FIG. 8) configured to tune the basic mode JFSR peak over a wide wavelength range, such as extended C-band. Optionally, the wavelength tuner 470 is provided as a dual-Etalon filter configured to pass the basic mode only. Optionally, the light with a wavelength tuned by the wavelength tuner 470 will be outputted to a second waveguide 492, or optionally be firstly coupled to a wavelength locker 480 to finely tune and lock to a specific wavelength within the extended C-band. Optionally, the light with its wavelength being selected by the wavelength locker 480 will be lased out. Optionally, a second laser chip 460 configured in a semiconductor optical amplifier (SOA) is added to couple with the second waveguide 492 before a laser exit port 440. The SOA provides a gain region 465 to further amplify the gain of the laser light before exiting via the laser exit port 440.

Similarly, the interference spectrum generated in the extended cavity associated with the wavelength tuner 470 and the gain region 415 includes multiple side mode JFSR peaks. For example with the JFSR being set to 85 nm, for a basic mode being set to a low-end of C-band at ~1526 nm, a long-wavelength side mode JFSR peak appears at ~1611 nm; for the basic mode being set to a high-end of C-band at ~1568 nm, a short-wavelength side mode JFSR peak appears at ~1483 nm. These side modes are near the tunable range, i.e., the extended C-band, becoming potential yet unwanted lasing modes of the wavelength tunable laser 20. In the embodiment, the first facet 401 of the chip of RSOA 410 is configured to add a coating to introduce a reflectivity dip around the long-wavelength side mode JFSR peak at ~1611 nm yet preserve the high-reflection (at least >90%) for wavelengths of shorter than 1580 nm. For example, the coating causes the light reflectivity dropping by 50% at about 1611 nm comparing to that in C-band. As a result, the long-wavelength side mode JFSR peak in the interference spectrum is effectively suppressed. Additionally in the embodiment, the gain region 415 of the chip of RSOA 410, which has a PN junction with an active layer as a normal laser diode, can be reconfigured to introduce an absorption layer in N-type cladding near the active layer (e.g., see FIG. 4). The location of the absorption layer is set to the N-type cladding where the free carrier density is high to help reduce the absorption loss. The location of the absorption layer is set to be near the active layer such that it is significantly overlapped with high-energy distribution region of the light excited in the active layer. For example, the active layer is formed as strained quantum well structure in the PN junction and the absorption layer is disposed 20-30% quantum confinement factor of the active layer quantum well. Furthermore, the absorption layer is configured to be a semiconductor material having a bandgap being set to be smaller than a predetermined value such that light absorption only occurs for wavelengths shorter than a certain value, for example, ~1490 nm. For example, with an absorption layer made by GaInAsP or AlGaInAs with a proper designed bandgap can provide an extra 50% loss to the gain profile for wavelengths shorter than 1490 nm. With the absorption layer described herein being added in the gain region 415, the short-wavelength side mode JFSR peak, whose wavelength is around ~1483 nm<1490 nm, can be substantially suppressed. The wavelength tunable laser 20 thus only lase out a laser with single wavelength at the basic mode JFSR peak, which is tunable in the C-band from 1526 nm to 1568 nm.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A reflective semiconductor optical amplifier comprising:
    a gain chip comprising:
        a diode formed by a first layer doped with a first type of dopant and a second layer doped with a second type of dopant disposed between an antireflective first facet and a partially reflective second facet, wherein the partially reflective second facet has a tilted antireflective coating with light reflectivity that decreases with increasing wavelength;
        an active layer formed between the first layer and the second layer and configured to generate light that is reflected by the partially reflective second facet; and
        an absorption layer formed in the second layer near the active layer; and
    a tuner configured to:
        receive through the antireflective first facet the light reflected by the partially reflective second facet; and output peaks separated by a predetermined wavelength range to the gain chip through the antireflective first facet;
    wherein the gain chip outputs a first peak as a laser light through the partially reflective second facet while the absorption layer suppresses a second peak of a lower wavelength than the first peak and the partially reflective second facet suppresses a third peak of a greater wavelength than the first peak.

2. The reflective semiconductor optical amplifier of claim 1 wherein the first and second types of dopants have opposite polarities.

3. The reflective semiconductor optical amplifier of claim 1 wherein the light generated by the active layer is amplified between the partially reflective second facet and the antireflective first facet before exiting through the antireflective first facet.

4. The reflective semiconductor optical amplifier of claim 1 wherein the partially reflective second facet has low-reflection characteristics providing decreased reflectivity for longer wavelengths than the first peak to suppress the third peak.

5. The reflective semiconductor optical amplifier of claim 1 wherein the absorption layer induces a loss in a gain profile of the gain chip for shorter wavelengths than the first peak to suppress the second peak.

6. The reflective semiconductor optical amplifier of claim 1 wherein the absorption layer has a bandgap set to less than a predetermined wavelength to absorb light with wavelengths shorter than the predetermined wavelength and to suppress the second peak.

7. The reflective semiconductor optical amplifier of claim 1 wherein the absorption layer has a bandgap set to less than a predetermined wavelength to absorb light with wavelengths shorter than the predetermined wavelength and to modify a gain profile of the gain chip for shorter wavelengths than the first peak to suppress the second peak.

8. The reflective semiconductor optical amplifier of claim 1 wherein the active layer comprises a quantum well that induces a laser that is amplified between the partially reflective second facet and the antireflective first facet with a gain at a predetermined wavelength.

9. The reflective semiconductor optical amplifier of claim 1 wherein the tuner comprises ring-shaped waveguides that output the peaks separated by the predetermined wavelength range, and wherein the predetermined wavelength range is determined by diameters of the ring-shaped waveguides.

10. The reflective semiconductor optical amplifier of claim 9 further comprising respective heaters to control temperatures of the ring-shaped waveguides and to tune the first peak to a single wavelength.

11. The reflective semiconductor optical amplifier of claim 10 further comprising a wavelength locker coupled to the tuner and the antireflective first facet to lock the first peak to the single wavelength.

12. The reflective semiconductor optical amplifier of claim 11 wherein the wavelength locker fine tunes the first peak to the single wavelength based on a temperature around the wavelength locker.

* * * * *